United States Patent
Fu et al.

(10) Patent No.: US 12,093,534 B2
(45) Date of Patent: Sep. 17, 2024

(54) METHOD FOR INHERITING DEFECT BLOCK TABLE AND STORAGE DEVICE THEREOF

(71) Applicant: RayMX Microelectronics, Corp., Hefei (CN)

(72) Inventors: Yinghui Fu, Hefei (CN); Yunlu Zhang, Hefei (CN); Hao Li, Hefei (CN)

(73) Assignee: RayMX Microelectronics, Corp., Hefei (CN)

( * ) Notice: Subject to any disclaimer, the term of this patent is extended or adjusted under 35 U.S.C. 154(b) by 212 days.

(21) Appl. No.: 17/932,309

(22) Filed: Sep. 15, 2022

(65) Prior Publication Data

US 2023/0221868 A1 Jul. 13, 2023

(30) Foreign Application Priority Data

Jan. 13, 2022 (CN) .......................... 202210034811.8

(51) Int. Cl.
*G06F 3/06* (2006.01)
*G06F 12/0875* (2016.01)

(52) U.S. Cl.
CPC .......... *G06F 3/0619* (2013.01); *G06F 3/0652* (2013.01); *G06F 3/0653* (2013.01); *G06F 3/0673* (2013.01); *G06F 12/0875* (2013.01); *G06F 2212/1032* (2013.01)

(58) Field of Classification Search
CPC .... G06F 3/0619; G06F 3/0652; G06F 3/0653; G06F 3/0673; G06F 12/0875; G06F 2212/1032; G06F 2212/7204; G06F 3/064; G06F 12/0246; G06F 3/0679; G11C 2029/4402; G11C 29/76
See application file for complete search history.

(56) References Cited

U.S. PATENT DOCUMENTS

| 10,930,350 B2 | 2/2021 | You |
| 11,481,272 B2 | 10/2022 | Kim |
| 2015/0262712 A1 | 9/2015 | Chen et al. |
| 2016/0266955 A1 | 9/2016 | Takeda et al. |
| 2021/0272645 A1 | 9/2021 | Yoon et al. |
| 2021/0312989 A1 | 10/2021 | Yun et al. |

FOREIGN PATENT DOCUMENTS

| CN | 103593303 A | 2/2014 |
| CN | 111354406 A | 6/2020 |
| CN | 113377687 A | 9/2021 |

*Primary Examiner* — Christopher D Birkhimer
(74) *Attorney, Agent, or Firm* — McClure, Qualey & Rodack, LLP

(57) ABSTRACT

Disclosed are a method for inheriting a defect block table and a storage device thereof. The method applied to a controller of a storage device includes the steps of: storing an original defect block table in a first storage location of a storage module of the storage device, wherein the original defect block table records defect block information of each plane of the storage module; and in response to a low-level format operation being performed on the storage device, reading the original defect block table, and executing a adaptive inheritance procedure based on a multi-plane mode in which the storage device operates, to generate and store a system defect block table in a second storage location of the storage module, wherein the system defect block table records defect block information corresponding to the multi-plane mode.

12 Claims, 5 Drawing Sheets

METHOD FOR INHERITING DEFECT BLOCK TABLE AND STORAGE DEVICE THEREOF

CROSS REFERENCE TO RELATED APPLICATION

This application claims the priority benefit of Chinese Patent Application Serial Number 202210034811.8, filed on Jan. 13, 2022, the full disclosure of which is incorporated herein by reference.

BACKGROUND

Technical Field

The present disclosure relates to the technical field of data storage, and in particular to a method for inheriting a defect block table and a storage device thereof.

Related Art

With the increasingly wide application of storage devices, the requirements for data reliability and operation efficiency of the storage devices also become higher. Therefore, the defect block management becomes a crucial issue.

A defect block (also known as bad block) refers to an unusable block in a storage module of a storage device, and it can be divided into two types: an original defect block and a newly added defect block. The original defect block refers to the block that does not meet the standards established by the manufacturer when the storage module is produced in the factory. The newly added defect block refers to the block that cannot operate normally or cannot meet the standards established by the manufacturer due to corruption during the use of the storage module. The defect block management refers to the management of the defect block table that records the defect block information of the storage module, so that the defect block can be skipped (e.g., be disabled access) to prevent the operation to the defect block when the storage module of the storage device operates, thereby avoiding affecting the reliability and efficiency of the storage device.

The existing storage device records the original defect blocks and newly added defect blocks in units of the number of planes operated by the storage device simultaneously through a stability testing process, and generates a defect block table. However, the above method for generating the defect block table has limitations. For example, when the storage device is not recognized due to damage or the firmware of the storage device is updated, the defect block table is lost; and when the plane mode in which the storage device operates is changed, the defect block table cannot be inherited. Therefore, the defect block table inheritance method is an important link in the development process of the storage device.

SUMMARY

The present disclosure provides a method for inheriting a defect block table and a storage device thereof, which can solve the problems in the prior art that the defect block table is lost when the storage device is not recognized by the host due to damage or the firmware of the storage device is updated, and the defect block table cannot be inherited when the plane mode in which the storage device operates is changed.

In order to solve the above technical problem, the present disclosure is implemented as follows.

The present disclosure provides a method for inheriting a defect block table of a storage device. The method comprises: storing an original defect block table in a first storage location of a storage module of the storage device, wherein the original defect block table records defect block information of each plane of the storage module; and in response to a low-level format operation being performed on the storage device, reading the original defect block table, and executing a adaptive inheritance procedure based on a multi-plane mode in which the storage device operates, to generate a system defect block table and store the system defect block table in a second storage location of the storage module, wherein the system defect block table records defect block information corresponding to the multi-plane mode.

The present disclosure provides a storage device, which comprises a storage module and a controller. The storage module includes a first storage location and a second storage location, the controller is coupled to the storage module. The controller is configured to read an original defect block table stored in the first storage location of the storage module, and execute a adaptive inheritance procedure based on a multi-plane mode in which the storage device operates, to generate a system defect block table and store the system defect block table in the second storage location in response to a low-level format operation being performed on the storage device, wherein the original defect block table records defect block information of each plane of the storage module, and the system defect block table records defect block information corresponding to the multi-plane mode.

In the method for inheriting the defect block table and the storage device thereof according to the embodiments of the present disclosure, the original defect block table generated in the unit of a single plane is stored in the first storage location of the storage module, and the system defect block table generated by the inheritance adaptive mechanism of the original defect block table is stored in the second storage location of the storage module, so that it can ensure that on the premise that the first storage location of the storage module is not corrupted, the original defect block table is not lost when the storage device is not recognized by the host due to damage in the whole system, or the firmware of the storage device is updated, and the function of inheriting the original defect block table is realized through the system defect block table.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
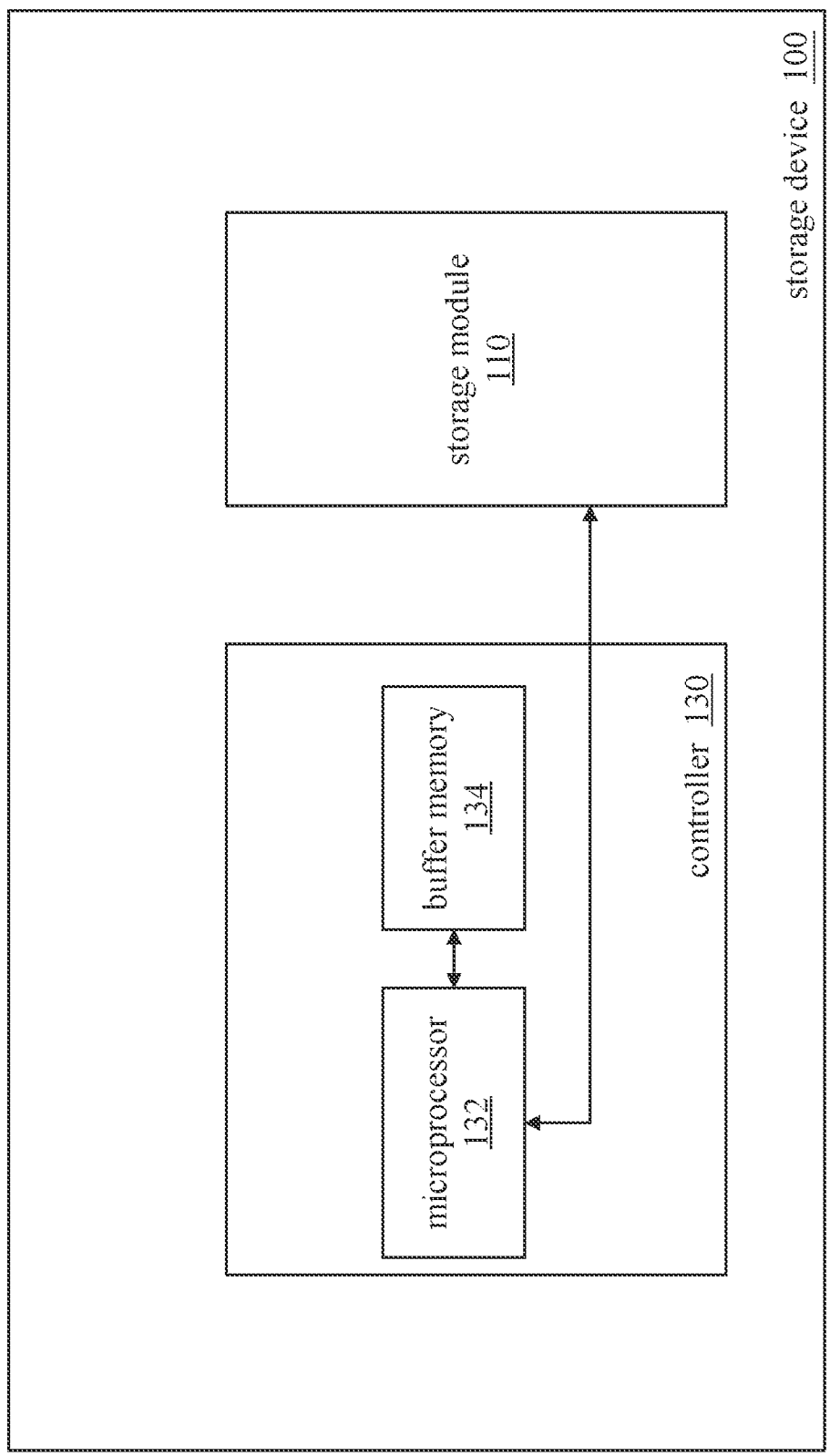
FIG. 1 is a block diagram of a storage device according to an embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to".

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

It must be understood that when a component is described as being "connected" or "coupled" to (or with) another component, it may be directly connected or coupled to other components or through an intermediate component. In contrast, when a component is described as being "directly connected" or "directly coupled" to (or with) another component, there are no intermediate components. In addition, unless specifically stated in the specification, any term in the singular case also comprises the meaning of the plural case.

In the following embodiment, the same reference numerals are used to refer to the same or similar elements throughout the disclosure.

Please refer to FIG. 1, which is a block diagram of a storage device according to an embodiment of the present disclosure. As shown in FIG. 1, the storage device 100 comprises a storage module 110 and a controller 130, the storage module 110 includes a first storage location and a second storage location, the controller 130 includes a microprocessor 132, and the microprocessor 132 is connected to the storage module 110. The storage device 100 may be, but not limited to, a solid-state drive (SSD); the storage module 110 may include a plurality of flash memory chips (e.g., 8, 16 or 32 NAND flash chips), each NAND flash memory chip may include one or more logical unit numbers (LUNs) (e.g., 4 or 8 LUNs), one LUN may include multiple planes, each plane may include multiple blocks, and each block may include multiple pages. In the storage module 110, the minimum writing unit is a page (e.g., 4 kilobytes or 512 bytes), which does not support data overwriting. That is, write operations can only be performed in idle or in erasing units, and the minimum erasing unit is a block. The storage module 110 has the characteristic that the storage device 100 does not lose stored data when the storage device 100 is powered off.

Referring to FIG. 1, the microprocessor 132 included in the controller 130 is configured to scan and detect the storage module 110 to generate an original defect block table and store the original defect block table in the first storage location. In some embodiments, the step of scanning and detecting the storage module 110 to generate the original defect block table is an optional step. The microprocessor 132 included in the controller 130 is further configured to read the original defect block table, and execute an adaptive inheritance procedure based on a multi-plane mode in which the storage device 100 operates, to generate a system defect block table and store the system defect block table in the second storage location in response to a low-level format (LLF) operation being performed on the storage device 100. The original defect block table records defect block information of each plane in the storage module 110, and the system defect block table records defect block information corresponding to the multi-plane mode. The microprocessor 132 needs to first confirm that the reserved first storage location is not in a defect block, and erase data stored in the first storage location for subsequent storage of the original defect block table. The second storage location is dynamically allocated when the LLF operation is performed.

Specifically, the defect blocks in each plane of the NAND flash memory chips included in the storage module 110 that are already produced in the factory can be determined by scanning the original defect block marks in the manner specified by the NAND specification, so as to determine whether the block to be tested in the storage module 110 is marked as a defect block when it leaves the factory. If the block to be tested in the storage module 110 is marked as a defect block, it is not necessary to perform detection on the block to be tested, and it is directly determined that the block to be tested is a defect block. If the block to be tested in the storage module 110 is not marked as a defect block, the detection is performed on the block to be tested to determine whether the block to be tested is a defect block. After scanning and detecting each block of the storage module 110, the microprocessor 132 generates the original defect block table according to the original defect block marks and the detection result, and stores the original defect block table in the first storage location. In other words, the defect block information of the original defect blocks and the newly added defect blocks is recorded in the original defect block table and kept (saved) all the time. On the premise that the first storage location of the storage module 110 is not corrupted, the original defect block table is not lost when the storage device 100 is not recognized by the host due to damage in the whole system, or the firmware of the storage device 100 is updated. The original defect block table is the defect block information of the storage device 100 in units of a single plane, and the defect block information may include defect block address information. In response to the LLF operation being performed, the microprocessor 132 first reads the original defect block table, and then generates a system defect block table according to the multi-plane mode (e.g., two-plane mode or four-plane mode) in which the storage device 100 operates, and stores the system defect block table in the second storage location, so that the original defect block table is always stored in the first storage location of the storage module 110, and retained no matter how many times the LLF operation is performed, and the system defect block table implements inheritance of the original defect block table.

It should be noted that the system defect block table generated in response to the LLF operation being performed can always be stored in the second storage location of the storage module 110, wherein the second storage location is dynamically allocated when the LLF operation is performed. In more detail, in response to the LLF operation being performed, data stored in the second storage location is erased and the system defect block table is written to the first portion of the second storage location; in the whole system, if there is a newly added defect block (e.g., a prematurely corrupted block), the system defect block table recorded in the second storage location is updated and written to the second portion of the second storage location; when the second storage location is full and the system defect block table needs to be updated, the oldest system defect block table, which is written to the first portion of the second storage location, is automatically erased, and the new system defect block table is written therein; that is, the second storage location is cyclically utilized.

In an example, the storage device 100 operates in a two-plane mode (that is, the storage device 100 sends an instruction once to perform the read-write-erase operation on two planes of a NAND flash memory chip simultaneously), so that the system defect block table generated by the microprocessor 132 when the LLF operation is performed is the defect block address information of the two-plane mode.

In another example, the storage device 100 operates in a four-plane mode (that is, the storage device 100 sends an instruction once to perform the read-write-erase operation on four planes of a NAND flash memory chip simultaneously), so that the system defect block table generated by the microprocessor 132 when the LLF operation is performed is the defect block address information of the four-plane mode.

In one embodiment, the microprocessor 132 can be further configured to generate a new original defect block table when the storage module 110 is scanned and detected after the original defect block table stored in the first storage location is erased, and write the new original defect block table to the first storage location. That is to say, only when the storage module 110 needs to be scanned and detected is the original defect block table erased and updated to the new original defect block table.

In one embodiment, the controller 130 may further comprise a buffer memory 134 coupled to the microprocessor 132. The buffer memory 134 is configured to store data temporarily required by the operation instructions running on the microprocessor 132, and the buffer memory 134 may be a volatile memory, such as a dynamic random access memory (DRAM), and a static random access memory (SRAM).

Figure 2:
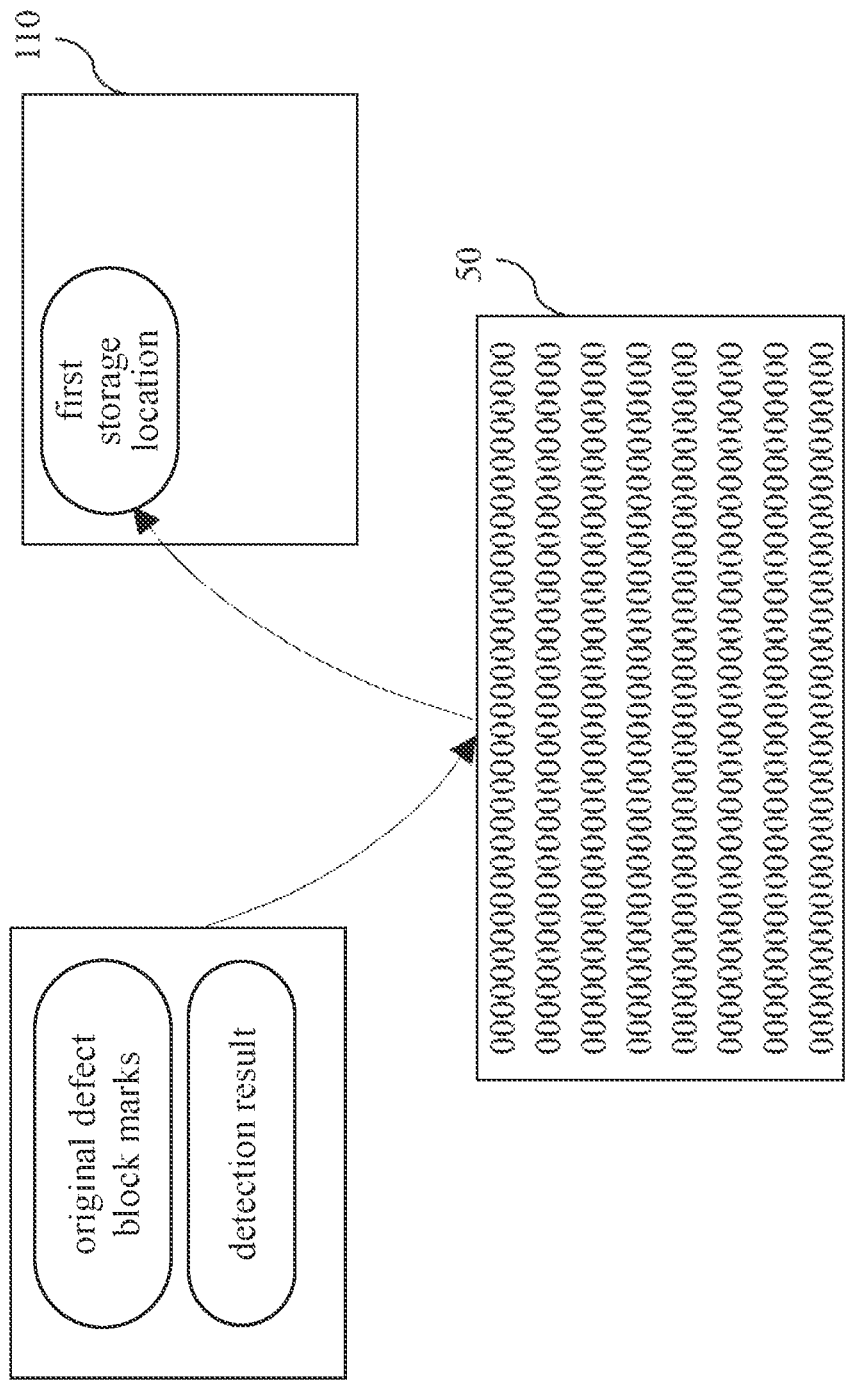
FIG. 2 is a schematic diagram of an embodiment in which the controller of FIG. 1 generates an original defect block table.

Please refer to FIG. 1 and FIG. 2. FIG. 2 is a schematic diagram of an embodiment in which the controller of FIG. 1 generates an original defect block table. The microprocessor 132 can be further configured to apply for a segment of storage space 50 in the buffer memory 134 and initialize the segment of storage space 50 to set each bit in the segment of storage space 50 to 0, wherein one bit of the segment of storage space 50 corresponds to a block of the storage module 110 (that is, the number of bits in the storage space 50 is the same as the number of blocks included in the storage module 110), each block of the storage module 110 is scanned and detected to set the bit corresponding to each block to a value to represent a defect block or a normal block operating normally, and then the original defect block table is generated. Specifically, the microprocessor 132 sets the value of each bit in the segment of storage space 50 according to the combination of the original defect block marks and the detection result to distinguish each block of the storage module 110 as a defect block or a normal block, thereby generating the original defect block.

In one example, the microprocessor 132 sets a bit corresponding to a block marked or detected as a defect block to 1, and sets a bit corresponding to a block marked or detected as a normal block to 0.

In another example, the microprocessor 132 sets a bit corresponding to a block marked or detected as a defect block to 0, and sets a bit corresponding to a block marked or detected as a normal block to 1.

Figure 3:
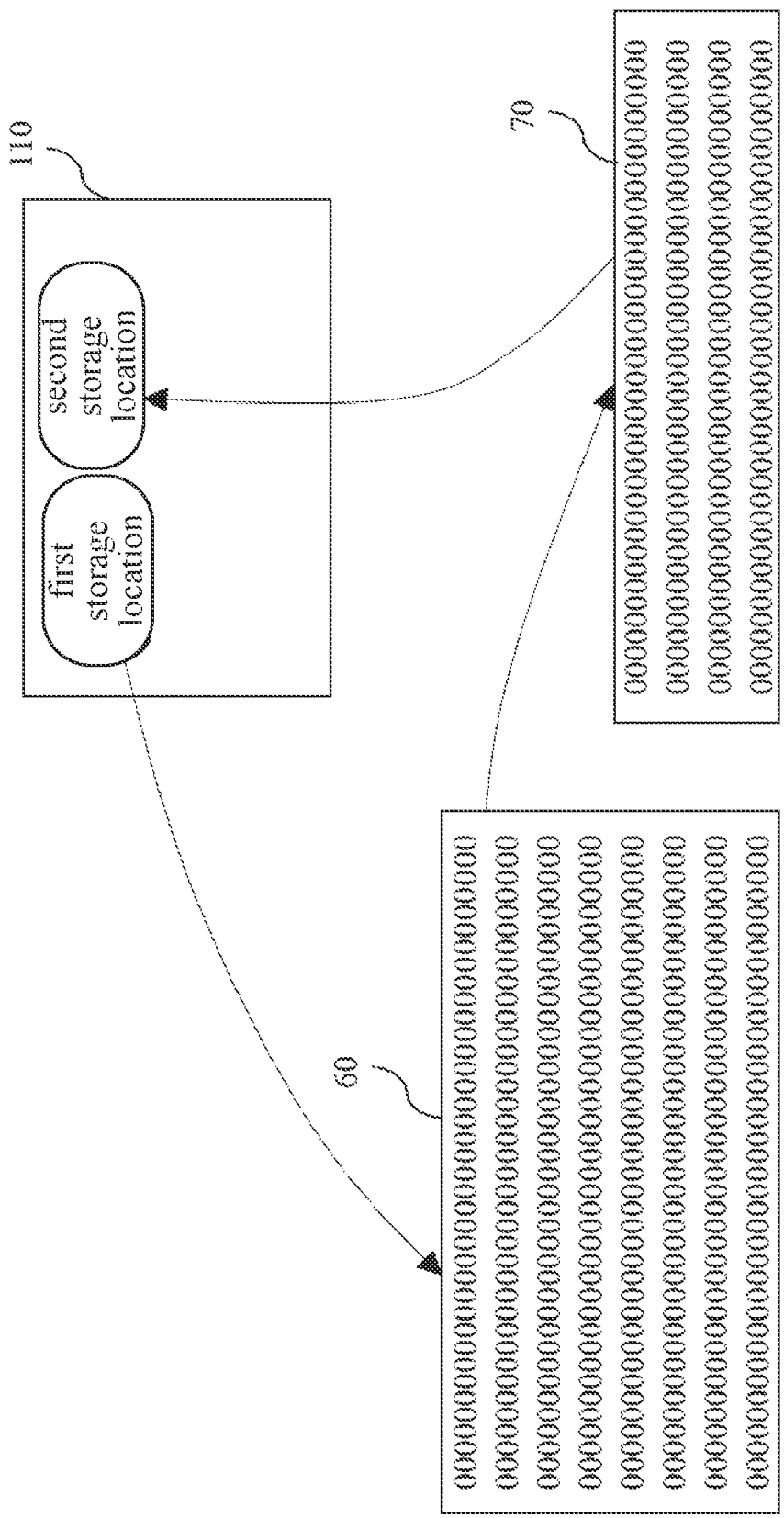
FIG. 3 is a schematic diagram of an embodiment in which the controller of FIG. 1 generates a system defect block table.

The following content is the description of executing the adaptive inheritance procedure according to the original defect block table to generate the system defect block table. Please refer to FIG. 1 and FIG. 3. FIG. 3 is a schematic diagram of an embodiment in which the controller of FIG. 1 generates a system defect block table. The microprocessor 132 can be further configured to apply for two segments of storage space 60 and 70 in the buffer memory 134 and initialize the two segments of storage space 60 and 70 to set each bit in the two segments of storage space 60 and 70 to 0 when the low-level format operation is performed on the storage module 110; read the original defect block table and store the original defect block table in one of the two segments of storage space 60 and 70 (i.e., the segment of storage space 60); and perform analysis of the original defect block table stored in the one of the two segments of storage space 60 and 70 in units of the number of planes (e.g., two planes or four planes) operated by the storage device 100 simultaneously to adaptively generate the system defect block table and store the system defect block table to the other of the two segments of storage space 60 and 70 (i.e., the segment of storage space 70), wherein one bit of the other of the two segments of storage space 60 and 70 corresponds to multiple blocks in which the planes (e.g., two planes or four planes) operate simultaneously; and store the system defect block table stored in the other of the two segments of storage space 60 and 70 (i.e., the segment of storage space 70) in the second storage location of the storage module 100.

For example, the microprocessor 132 performs analysis in units of N-planes (e.g., two planes or four planes), and sets each bit corresponding to multiple blocks that operate in a N-plane mode simultaneously to a value corresponding thereto based on an analysis result, to record the defect block address information of the N-plane mode (i.e., the system defect block table is generated), and store the system defect block table in the second storage location of the storage module 110, wherein N is an integer and greater than 1. The size of the storage space for storing the system defect table is smaller than the size of the storage space for storing the original defect block table. If the analysis is performed with two planes, the size of the storage space for storing the system defect block table is half of the storage space of the original defect block table. If the analysis is performed with four planes, the size of the storage space for storing the system defect block table is a quarter of the storage space of the original defect block table.

Figure 4:
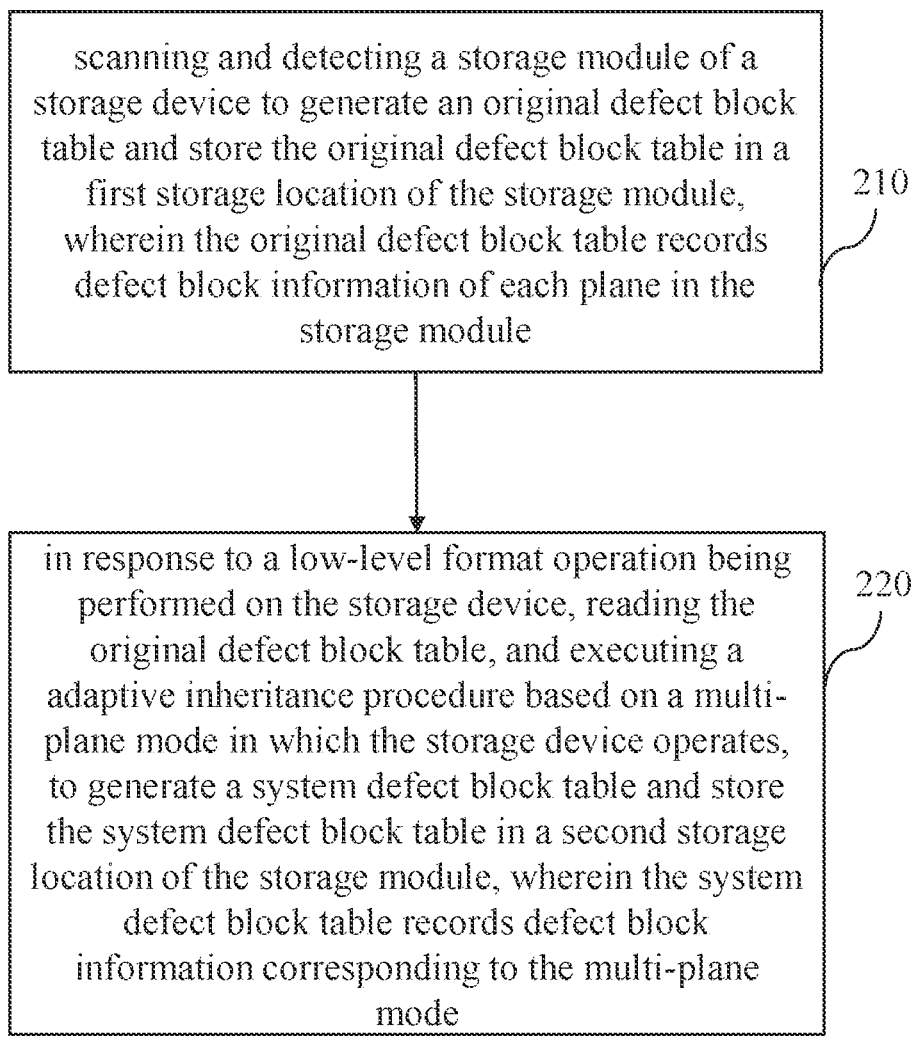
FIG. 4 is a method flowchart of a method for inheriting a defect block table according to an embodiment of the present disclosure.

Please refer to FIG. 1 and FIG. 4. FIG. 4 is a method flowchart of a method for inheriting a defect block table according to an embodiment of the present disclosure. For the convenience of description, the method for inheriting the defect block table in FIG. 4 described in conjunction with the storage device 100 in FIG. 1, but it is not limited thereto. Any changes and modifications may be made by those skilled in the art without departing from the spirit and scope of the present disclosure. As shown in FIG. 4, the method comprises the following steps: scanning and detecting a storage module 110 of a storage device 100 to generate an original defect block table and store the original defect block table in a first storage location of the storage module 110, wherein the original defect block table records defect block information of each plane in the storage module 110 (step 210); and in response to a low-level format operation being performed on the storage device 100, reading the original defect block table, and executing a adaptive inheritance procedure based on a multi-plane mode in which the storage device 100 operates to generate a system defect block table and store the system defect block table in a second storage location of the storage module 110, wherein the system defect block table records defect block information corresponding to the multi-plane mode (step 220). Through steps 210 to 220, on the premise that the first storage location of the storage module 110 is not corrupted, it can be ensured that the original defect block table is not lost when the storage device 100 is not recognized by the host due to damage in the whole system, or the firmware of the storage device 100 is updated, and the function of inheriting the original defect block table is realized through the system defect block table. For a detailed description, reference may be made to the relevant description of the above-mentioned storage device 100, which is not repeated here.

In one embodiment, the step 210 of scanning and detecting the storage module 110 of the storage device 100 to generate the original defect block table comprises: applying for a segment of storage space in a buffer memory 134 and initializing the segment of storage space, wherein one bit of the segment of storage space corresponds to a block of the storage module 110; and scanning and detecting each block of the storage module 110 to set a bit corresponding to each block to a value to indicate that each block is a defect block or a normal block, and generate an original defect block table. In an example, the step of setting of the bit corresponding to each block to the value to indicate that each block is the defect block or the normal block comprises: setting a bit corresponding to a block marked or detected as a defect block to 1; and setting a bit corresponding to a block marked or detected as a normal block to 0. In another example, the step of setting of the bit corresponding to each block to the value to indicate that each block is the defect block or the normal block comprises: setting a bit corresponding to a block marked or detected as a defect block to 0; and setting a bit corresponding to a block marked or detected as a normal block to 1. For a detailed description, reference may be made to the relevant description of the above-mentioned storage device 100, which is not repeated here.

In one embodiment, step 220 may comprise: when the low-level formatting operation is performed on the storage module 110, applying for and initializing two segments of storage space in a buffer memory 134; reading the original defect block table and storing the original defect block table in one of the two segments of storage space; performing analysis of the original defect block table stored in the one of the two segments of storage space in units of the number of planes operated by the storage device 100 simultaneously to adaptively generate the system defect block table and store the system defect block table to the other of the two segments of storage space; and storing the system defect block table stored in the other of the two segments of storage space in the second storage location of the storage module 110. For a detailed description, reference may be made to the relevant description of the above-mentioned storage device 100, which is not repeated here.

In one embodiment, the adaptive inheritance procedure described in step 220 may comprise: performing analysis in units of N-planes, and setting each bit corresponding to multiple blocks that operate in a N-plane mode simultaneously to a value based on an analysis result, to record defect block address information of the N-plane mode, wherein N is an integer and greater than 1. For a detailed description, reference may be made to the relevant description of the above-mentioned storage device 100, which is not repeated here.

Figure 5:
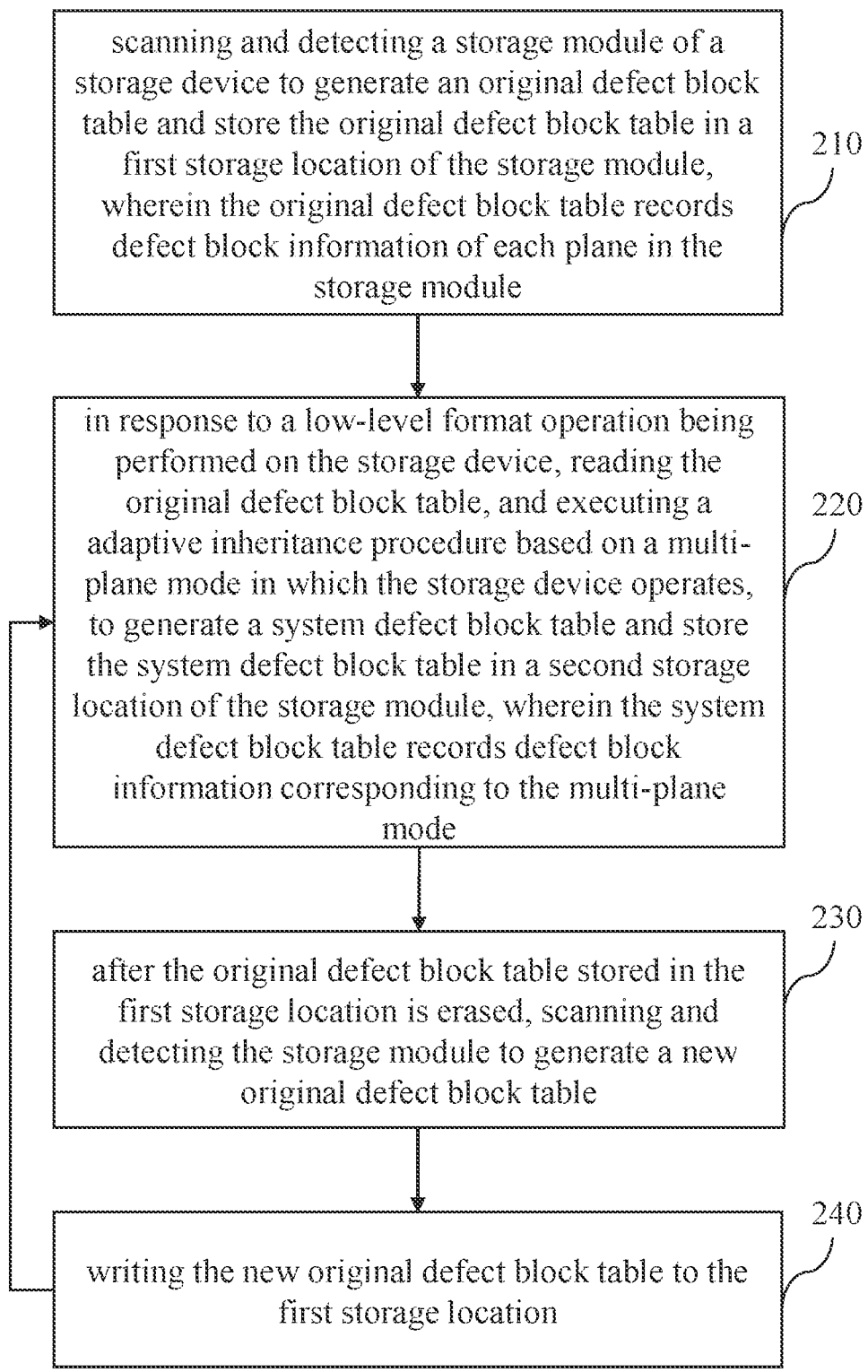
FIG. 5 is a method flowchart of a method for inheriting a defect block table according to another embodiment of the present disclosure.

Please refer to FIG. 1 and FIG. 5. FIG. 5 is a method flowchart of a method for inheriting a defect block table according to another embodiment of the present disclosure. As shown in FIG. 5, in addition to steps 210 and 220, the method for inheriting the defect block table may further comprise: after the original defect block table stored in the first storage location is erased, scanning and detecting the storage module 110 to generate a new original defect block table (step 230); and writing the new original defect block table to the first storage location (step 240). For a detailed description, reference may be made to the relevant description of the above-mentioned storage device 100, which is not repeated here.

In summary, in the method for inheriting the defect block table and the storage device thereof according to the embodiments of the present disclosure, the original defect block table generated in the unit of a single plane is stored in the first storage location of the storage module, and the system defect block table generated by the inheritance adaptive mechanism of the original defect block table is stored in the second storage location of the storage module, so that it can ensure that on the premise that the first storage location of the storage module is not corrupted, the original defect block table is not lost when the storage device is not recognized by the host due to damage in the whole system, or the firmware of the storage device is updated, and the function of inheriting the original defect block table is realized through the system defect block table. In addition, only when the storage module needs to be scanned and detected is the original defect block table, which is stored in the first storage location, erased and the new original defect block table written to the first storage location.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A method for inheriting a defect block table of a storage device, the method comprising:
storing an original defect block table in a first storage location of a storage module of the storage device, wherein the original defect block table records defect block information of each plane of the storage module;
performing a low-level format operation; and
in response to the low-level format operation being performed on the storage device, reading the original defect block table, and executing an adaptive inheritance procedure based on a multi-plane mode in which the storage device operates to generate a system defect block table and store the system defect block table in a second storage location of the storage module, wherein the system defect block table records defect block information corresponding to the multi-plane mode.

2. The method according to claim 1, further comprising:
after the original defect block table stored in the first storage location is erased, scanning and detecting the storage module to generate a new original defect block table; and
writing the new original defect block table to the first storage location.

3. The method according to claim 1, wherein the adaptive inheritance procedure comprises:
performing analysis in units of N-planes, and setting each bit corresponding to multiple blocks that operate in a N-plane mode simultaneously to a value corresponding thereto based on an analysis result, to record defect block address information of the N-plane mode, wherein N is an integer and greater than 1.

4. The method according to claim 1, further comprising:
scanning and detecting blocks of the storage module to generate the original defect block table.

5. The method according to claim 4, wherein the step of scanning and detecting the blocks of the storage module further comprises:
applying for and initializing a segment of storage space in a buffer memory, wherein one bit of the segment of storage space corresponds to a block of the storage module; and
scanning and detecting on each block of the storage module, setting a bit corresponding to each block to a value to indicate that each block is a defect block or a normal block, and generating the original defect block table.

6. The method according to claim 5, wherein the step of setting the bit corresponding to each block to the value to indicate that each block is the defect block or the normal block comprises:
setting a bit corresponding to each block marked as a defect block or detected as the defect block to 1; and
setting a bit corresponding to each block marked as a normal block or detected as the normal block to 0.

7. The method according to claim 1, wherein the step of reading the original defect block table, and executing the adaptive inheritance procedure further comprises:
when the low-level formatting operation is performed on the storage module, applying for and initializing two segments of storage space in a buffer memory;
reading the original defect block table and storing the original defect block table in one of the two segments of storage space;
performing analysis of the original defect block table stored in the one of the two segments of storage space in units of the number of planes operated by the storage device simultaneously to adaptively generate the system defect block table and store the system defect block table to the other of the two segments of storage space; and
storing the system defect block table stored in the other of the two segments of storage space in the second storage location of the storage module.

8. A storage device, comprising:
a storage module, including a first storage location and a second storage location; and
a controller, coupled to the storage module, and configured to read an original defect block table stored in the first storage location of the storage module, and execute an adaptive inheritance procedure based on a multi-plane mode in which the storage device operates to generate a system defect block table and store the system defect block table in the second storage location in response to a low-level format operation being performed on the storage device;
wherein the original defect block table records defect block information of each plane of the storage module, and the system defect block table records defect block information corresponding to the multi-plane mode.

9. The storage device according to claim 8, wherein the controller is further configured to scan and detect the storage module to generate a new original defect block table after the original defect block table stored in the first storage location is erased; and write the new original defect block table to the first storage location.

10. The storage device according to claim 8, further comprising:
a buffer memory, coupled to the controller, wherein the controller is configured to apply for and initialize a segment of storage space in the buffer memory, wherein one bit of the segment of storage space corresponds to a block of the storage module; and scan and detect each block of the storage module, set a bit corresponding to each block to a value to indicate that each block is a defect block or a normal block and generate the original defect block table.

11. The storage device according to claim 10, wherein the controller is configured to set a bit corresponding to a block marked or detected as a defect block to 1, and set a bit corresponding to a block marked or detected as a normal block to 0.

12. The storage device according to claim 8, further comprising:
a buffer memory, coupled to the controller, wherein the controller is configured to apply for and initialize two segments of storage space in the buffer memory when the low-level formatting operation is performed on the storage module, read the original defect block table and store the original defect block table in one of the two segments of storage space, perform analysis of the original defect block table stored in the one of the two segments of storage space in units of the number of planes operated by the storage device simultaneously to adaptively generate the system defect block table and store the system defect block table to the other of the two segments of storage space, and store the system defect block table stored in the other of the two segments of storage space in the second storage location of the storage module.

\* \* \* \* \*